Oct. 1, 1957 L. E. NORTON 2,808,512

FREQUENCY-STABILIZATION OF HIGH-POWER GENERATORS

Filed May 2, 1955

INVENTOR.
LOWELL E. NORTON
BY J. L. Whittaker
ATTORNEY

United States Patent Office 2,808,512

Patented Oct. 1, 1957

2,808,512

FREQUENCY-STABILIZATION OF HIGH-POWER GENERATORS

Lowell E. Norton, Princeton, N. J., assignor to Radio Corporation of America, a corporation of Delaware Application May 2, 1955, Serial No. 505,112

15 Claims. (Cl. 250—36)

Figures 1, 2:
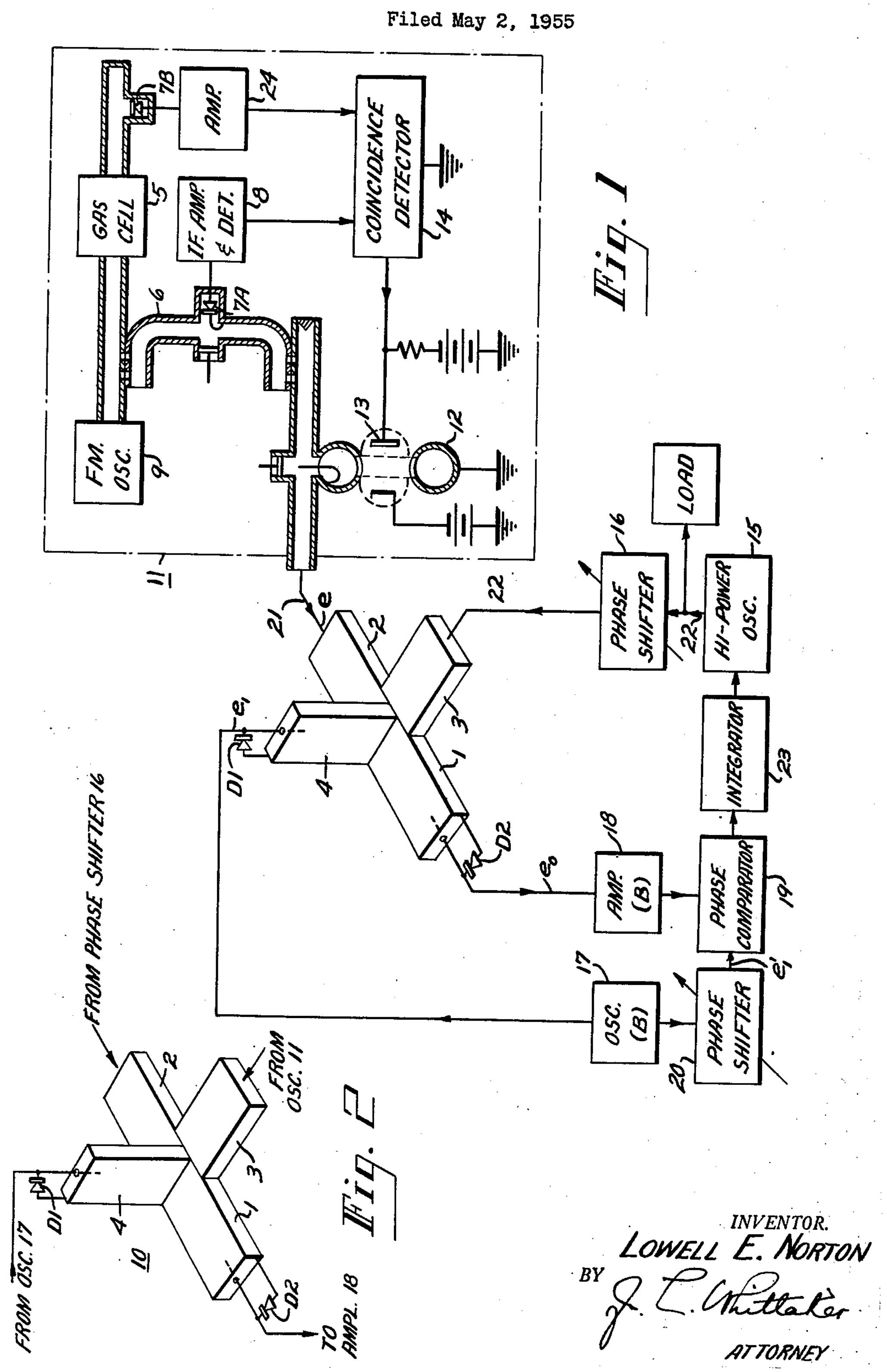

This invention relates to improved methods and systems for precise frequency-stabilization of high-power microwave generators.

In accordance with the present invention, difficulties sometimes encountered in effecting rigid frequency-stabilization of high-power microwave oscillators from molecular frequencies of gases or from transition frequencies of molecular, atomic or nuclear beams are avoided by locking the high-power microwave oscillator in phase with a low-power microwave oscillator so stabilized. The phase of a high-power oscillator is closely controlled by a reference phase output derived from a low-power oscillator which is controlled by a spectral line frequency standard. The phase-locking method and apparatus provides decoupling of the microwave oscillators at their operating frequencies in avoidance of interactions detrimental to frequency-stabilization and utilizes a modulation frequency to convey phase-shift information which is utilized to check, at its inception, any drift in frequency of the high-power oscillator.

In a typical embodiment of the invention, outputs from the frequency-stabilized low-power oscillator and a modulation-frequency oscillator are mixed to produce microwave sideband frequencies. The microwave sideband frequencies and the output from a low-power microwave oscillator are applied to a demodulator to provide a signal of modulation frequency whose phase varies with variations in the phase difference between the high-power and low-power microwave oscillators. This modulation signal and a phase-reference signal derived from the modulation oscillator are applied to a comparison circuit to produce a control signal which is applied to the high-power oscillator in correction of any tendency for frequency drift.

Further, and more specifically, the outputs of the two microwave oscillators are respectively applied to side and cross arms of a magic-tee junction whose other side and cross arms are terminated by diodes. In absence of application of the modulation signal to one of the diodes, the terminations of the magic-tee are matched and no reflections occur. With a modulation signal applied to one of the diodes, the corresponding termination is not matched and the sideband energy is reflected in the magic-tee to the other diode. The sideband energy and the oscillator outputs are mixed in this other diode to produce the phase information signal at the modulation frequency.

For a more detailed description of the invention and for illustration of a preferred system embodying it, reference is made to the accompanying drawing in which:

Figure 1 schematically illustrates a system for producing rigidly stabilized high-power oscillations; and Figure 2 is a second embodiment of the invention.

Similar reference characters are applied to similar elements throughout the drawing.

As exemplary of low-power microwave oscillator systems stabilized in accordance with the invention, reference is made to the schematic circuitry within block 11 of Figure 1. In the particular system therein shown, the low-power oscillator tube 12 is a reflex klystron having a frequency control electrode 13 whose bias is in part supplied by a phase-comparator or coincidence detector 14.

One input circuit of detector 14 is supplied with a series or train of pulses, each pulse occurring as the difference in frequency between oscillator 12 and a frequency-modulated oscillator 9 passes through the frequency-selective circuits of a low or intermediate frequency amplifier. The input for this channel is obtained by connecting the outputs of oscillators 9, 12 through directional couplers 6 to diode 7A in the input circuit of amplifier 8.

The other input circuit of detector 14 is supplied with a second series or train of pulses, each pulse occurring as the frequency of the modulated microwave oscillator 9 passes through a molecular resonance frequency ($\omega$) of a gas confined at low pressure in cell 5. The gas may comprise one of a number of gases which exhibit molecular resonance at microwave frequencies, for example, ammonia, carbonyl sulfide, or one of the methyl halides. The gas pressure is low, of the order of $10^{-3}$ millimeters of mercury or less. For such purpose, the microwave energy transmitted by the gas is impressed upon diode 7B to provide pulses which are amplified by an amplifier 14 in the second input circuit of coincidence detector 14. The output of detector 14 is zero when a pair of pulses respectively supplied to its two input circuits coincide in time. When these pulses do not coincide, the detector output is of positive or negative polarity depending upon which series of input pulses is earlier in time. The detector output is applied to the frequency control electrode 13 of the klystron 12 to stabilize its frequency.

Thus the frequency of oscillator 12 is rigidly stabilized, but its power output is small, usually not more than a few milliwatts. Such low-power limitation is characteristic of many frequency-stabilized microwave oscillator systems of which block 11 is generically representative.

In accordance with the present invention, a microwave oscillator 15 capable of supplying power to a load at levels which are many times, for example 100 times or more, higher than that of source 11, is locked in phase with the low-power source 11 without adversely affecting the precise frequency-stabilization of the low-power source. The particular system shown in Figure 1 includes a hybrid network or junction, such as magic-tee 10 having a pair of side arms 1, 2 and a pair of cross arms 3, 4. The side arm 1 and the cross arm 4 are respectively terminated in diodes D2, D1. The other side arm 2 and the other cross arm 3 are respectively connected by suitable microwave transmission lines 21, 22, such as waveguides, to the frequency-stabilized low-power microwave source 11 and to the high-power microwave oscillator 15 which is subject to frequency drift. The diode D1 is supplied with a modulation-frequency signal by oscillator 17 operating at frequency $\beta$ which may, for example, be about 30 megacycles/second. The modulation-frequency signal may be expressed as $$e_1 = E_1 \sin \beta t \tag{1}$$

For simplicity of explanation, the termination of arms 1, 2 and 3 are assumed matched as is the termination of arm 4 in absence of the modulating signal. It is to be understood, however, that the matching requirements are not severe and that some mismatch is permissible.

The output $e$ of the low-power source 11, may be expressed as $$e = E \sin \omega t \tag{2}$$

and is propagated into arm 3 where it is not reflected because of the matched termination. Output $e$ also is propagated into arm 4 where it would be completely absorbed in absence of the modulating signal. However, with modulation applied, the diode D1 provides a termination having a positive reflection coefficient for half-cycles of one sense of the modulation frequency and having a negative reflection coefficient for the half-cycles of opposite sense. Under this operating condition, the termination of arm 4 is not matched and the microwave fields reflected back into arm 4 by diode D1 are $$(3)\quad e_2=kEE_1(\cos[(\omega-\beta)t+\varphi_L]-\cos[(\omega+\beta)t+\varphi_U])$$

where $k$ is a numerical coefficient less than unity, $\varphi_L$ is phase delay for lower sideband $(\omega-\beta)$, and $\varphi_U$ is phase delay for upper sideband $(\omega+\beta)$.

The reflected sidebands $(\omega-\beta)$, $(\omega+\beta)$ are propagated into arm 2 where they are not reflected because of the matched terminations and into arm 1 where they excite diode D2. The reflected sidebands are not propagated in cross arm 3 because of the polarization of the electric fields of the sidebands.

The output from the high-power oscillator 15 supplied to cross arm 3 of magic-tee 10 similarly is not propagated in cross arm 4. It is propagated in arm 2 where it is absorbed because of the matched termination. It is also propagated in arm 1 and hence excites diode D1 together with the sideband fields from the low-power oscillator 11.

Hence with modulation applied to diode D1, the diode D2 is subjected to the fields $$(4)\quad e_{D2}=E_3\sin[\omega t+\psi+\varphi_C+\varphi(t)]+kEE_1(\cos[(\omega-\beta)t+\varphi_L']-\cos[(\omega+\beta)t+\varphi_U'])$$

where $\psi$ is adjustable phase of phase shifter, $\varphi_C$ is phase delay of carrier path, $\varphi(t)$ is the undesired instability, $\varphi_L'$ is the phase delay for lower sideband $(\omega-\beta)$, and $\varphi_U'$ is the total phase delay for upper sideband $(\omega+\beta)$.

Simplifying by omission of double-carrier frequency terms of the order of $2\omega$ which are not here significant, the output of diode D2 may be expressed as $$(5)\quad e_0=k'EE_1E_3(\sin[\beta t+\varphi_C-\varphi_L'+\psi+\varphi(t)]+\sin[\beta t+\varphi_U-\varphi_C-\psi-\varphi(t)])$$

Because the sidebands are symmetrically spaced from the carrier frequency, Equation 5 may be rewritten in simpler form as $$(6)\quad e_0=EE_1E_3(\sin[\beta t+\delta+\psi+\varphi(t)]+\sin[\beta t-\delta-\psi-\varphi t])$$

where $\delta=\varphi_U'-\varphi_C=\varphi_C-\varphi_L'$.

A phase-shifter 16 of any suitable type, such as a line stretcher, is included in the transmission line 22 between the high-power oscillator 15 and arm 3 of the magic-tee. This phase-shifter is so set or adjusted effectively to advance or retard by odd multiples of 90° the phase of the oscillator output as applied to arm 3. I. e., the phase shifter is adjusted so that $$(7)\quad \psi=(2n+1)\frac{\pi}{2}$$

where $n$ is an integer and $$\frac{\pi}{2}=90°\text{ electrical}$$

The result is that the output of diode D2 (Equation 6) reduces to $$(8)\quad e_0=\pm 2k'EE_1E_3\sin\varphi(t)\sin(\beta t+\delta)$$

the positive or negative sign depending upon whether $n$ is chosen to be odd or even.

The significant point is that the output $e_0$ of the diode D2 is zero when the instability or deviation term $[\varphi(t)]$ is zero; is of one polarity or phase for one sense of the deviation; and is of opposite polarity or phase when the deviation is of opposite sense.

The output of diode D2 of frequency $\beta$ is applied via an amplifier 18 to one input circuit of a suitable phase-comparator 19. A reference phase of the same frequency is applied to a second input circuit of phase-detector 19 from the modulating oscillator 17 which need not be stabilized. One or the other of these input circuits includes a phase-shifter 20 of the type suitable for the output of the signal at frequency $\beta$. The phase-shifter 20 is set or adjusted to obtain zero output of the phase-comparator 19 when the high-power microwave oscillator 15 is locked in phase to the low-power microwave generator 11.

In the particular arrangement shown, the phase-shifter 20 is included in the input circuit from phase-comparator 19 to the modulating oscillator 17 so that the phase-reference signal is $$(9)\quad e_1'=E_1\sin(\beta t-\psi_r)$$

Phase-shifter 20 is set or adjusted that $$(10)\quad \psi_r=m\pi+\delta$$

where $m$ is an integer and $\pi=180°$ electrical.

With $e_0$ (Equation 8) and $e_1'$ (Equation 9) as input signals, the output signal of the phase-comparator 19 is $$(11)\quad e_c=\pm k'''EE_1^2E_3\sin\varphi(t)$$

where the positive or negative sign depends upon whether $m$ is chosen to be even or odd, respectively.

For automatic control, the output signal of phase-comparator 19 is applied to an integrator network, exemplified by block 23, and used in any suitable manner per se known to control the high-power oscillator 15. For example, this signal may be applied to the grid of a high-power magnetron or a frequency control electrode of a high-power klystron.

The control voltage applied to the frequency control electrode of the high-power oscillator is zero when the instability or deviation term $[\varphi(t)]$ of the output of diode D2 is zero; is of one sign for one polarity of that term; and is of opposite sign for the other polarity thereof. This control voltage as applied to oscillator 15 locks the high-power oscillations in fixed phase relation to the low-power oscillations produced by the frequency-stabilized microwave generator 11.

As an alternative to the system described with reference to Figure 1, the relative positions of the outputs of oscillators 12, 15 may be reversed with respect to the arms 2, 3 of magic-tee 10, as shown in Figure 2. Output from oscillator 12 then is applied to arm 3, and output from oscillator 15 to arm 2. Except that the sideband frequencies are for oscillator 15 output, the explanation of operation is as before.

What is claimed is:

1. A system for stabilizing the frequency of high-power microwave oscillations subject to frequency drift which comprises, means for generating at a relatively low-power level microwave oscillations of stabilized frequency, means for modulating the low-power frequency stabilized oscillations to produce microwave sidebands, means for combining said microwave sidebands with both high-power and low-power microwave oscillations, means for demodulating the combined microwave energies to produce a phase-sensitive signal the phase of which varies with variation of the phase-difference between the microwave oscillations respectively generated by said low-power and said high-power oscillators, and means for utilizing said phase-sensitive signal to control said high-power microwave oscillations to minimize variations in the phase of said phase-sensitive signal.

2. A system for stabilizing the frequency of high-power microwave oscillations subject to frequency drift which comprises, means for generating at a relatively low-power level microwave oscillations of stabilized frequency, means for modulating the low-power frequency-stabilized microwave oscillations to produce microwave sidebands, means for combining the microwave sidebands with high-power microwave oscillations demodulating the combined microwave energies to produce a phase-sensitive signal the phase of which varies with variation of the phase-difference between said high-power and low-power microwave oscillations respectively generated by the low and high-power oscillators, and means for utilizing said phase sensitive signal for controlling the high-power oscillations to minimize variations in phase of said phase-sensitive signal.

3. A system as in claim 2 including means for producing a phase-reference signal of modulation frequency and means for combining said phase-reference signal and said phase-sensitive signal to produce a control signal for controlling said high-power microwave oscillations.

4. A system as in claim 3 in which the phase of the high-power microwave oscillations and the phase of the modulation-frequency reference signal are adjusted to provide zero magnitude of the control signal when said oscillators are in phase and to provide polarities of the control signal which check, at inception, frequency drift of said high-power microwave oscillations in either sense from the stabilized frequency of said low-power microwave oscillations.

5. A system for stabilizing the frequency of a high-power microwave oscillator comprising, a low-power microwave oscillator producing a microwave carrier of stabilized frequency, modulator means to which said microwave carrier and a modulation frequency signal are applied to produce microwave sidebands, demodulator means to which said microwave sidebands and the microwave carrier from said high-power oscillator are applied to produce a phase-sensitive signal whose phase varies with variation of the phase-difference between the microwave oscillations respectively generated by said low-power and high-power oscillators, and means for utilizing said phase-sensitive signal for controlling said high-power oscillator to minimize variations in the phase of said phase-sensitive signal.

6. A system for stabilizing the frequency of a high-power microwave oscillator comprising, a low-power microwave oscillator producing a microwave carrier of stabilized frequency, modulator means to which said microwave carrier and a modulation frequency signal are applied to produce microwave sidebands, demodulator means to which said microwave sidebands and microwave carriers from both of said microwave oscillators are applied to produce a phase-sensitive signal whose phase varies with variation of the phase-difference between said microwave carriers, and means for utilizing said phase-sensitive signal for controlling said high-power oscillator to minimize variations in the phase of said phase-sensitive signal.

7. In a system for stabilizing the frequency of a high-power microwave oscillator, a low-power microwave oscillator producing a microwave carrier of stabilized frequency, modulator means to which said microwave carrier and a modulation frequency signal are applied to produce microwave sidebands, demodulator means to which said microwave sidebands and the microwave carrier from said high-power microwave oscillator are applied to produce a phase-sensitive signal whose phase varies with variation of the phase-difference between said microwave carriers, and means including a phase-comparator to which said phase-sensitive signal and a phase-reference signal are applied for producing an output signal whose polarity and amplitude correspond with the sense and magnitude of said phase-difference of the microwave carriers.

8. A system for automatically stabilizing the frequency of a high-power microwave oscillator comprising a low-power microwave oscillator for producing a microwave carrier of stabilized frequency, a source of modulation-frequency, modulator means to which said microwave carrier and modulation-frequency energy from said source are applied to produce microwave sidebands, demodulator means to which said microwave sidebands and microwave carriers from both of said microwave oscillators are applied to produce a phase-sensitive signal whose phase varies with variation of the phase-difference between said microwave carriers, means for deriving a phase-reference signal from said modulation-frequency source, and means including a phase-comparator to which said phase-reference signal and said phase-sensitive signal are applied for producing a direct-current control signal applied to said high-power microwave oscillator and whose polarity and amplitude correspond with the sense and magnitude of said phase-difference of the microwave carriers.

9. In a system including a high-power microwave oscillator, a magic-tee having a pair of side arms and a pair of cross-arms, one of said cross-arms being supplied from said high-power oscillator, a low-power microwave oscillator connected to one of said side arms, diodes respectively connected to the other cross-arm and the other side arm of said magic-tee, and means for applying a modulation-frequency to one of said diodes, the other of said diodes producing a phase-sensitive signal whose phase varies with variation of the phase-difference between the outputs of said microwave oscillators.

10. An arrangement as in claim 9 additionally including a phase-shifter in circuit between said high-power microwave oscillator and said one of the cross-arms of the magic-tee.

11. An arrangement as in claim 9 additionally including a phase-comparator having input circuits respectively connected to said other of the diodes and to the modulation-frequency source.

12. An arrangement as in claim 11 additionally including a phase-shifter in one of the input circuits of the phase-comparator.

13. An arrangement as in claim 11 additionally including a phase-shifter in circuit between said high-power oscillator and said one arm of the magic-tee, said phase-shifters being adjusted to provide zero output of the phase-comparator for zero phase-difference between the microwave inputs to the magic-tee.

14. A system for producing high-power frequency-stabilized microwave oscillations comprising a high-power microwave oscillator subject to frequency instability, a low-power microwave oscillator whose frequency is stabilized, a magic-tee having two arms respectively connected to said oscillators, diodes connected to the other two arms of said magic-tee, a source of modulation-frequency connected to one of said diodes, and means for producing a control signal for said high-power oscillator comprising a phase-comparator having input circuits respectively connected to the other of said diodes and to said source of modulation-frequency.

15. A system as in claim 14 additionally including phase-shifting means, one in one of said input circuits of the comparator and another in circuit between said high-power oscillator and the magic-tee.

References Cited in the file of this patent

UNITED STATES PATENTS

| | | |
|---|---|---|
| 2,462,841 | Bruck et al. | Mar. 1, 1949 |
| 2,486,001 | Bruck et al. | Oct. 25, 1949 |

OTHER REFERENCES

"Recent Developments in Freq. Stab. of Micr. Osc.," Tuller et al., I. R. E., vol. 36, No. 6, June 1948, pages 794–800.